United States Patent
Turner et al.

(10) Patent No.: US 7,490,231 B2
(45) Date of Patent: Feb. 10, 2009

(54) METHOD AND SYSTEM FOR BLOCKING DATA IN SCAN REGISTERS FROM BEING SHIFTED OUT OF A DEVICE

(75) Inventors: Tony Michael Turner, Foothill Ranch, CA (US); Jonathan Huy Kuo, Aliso Viejo, CA (US); Jack Arnold Manson, Irvine, CA (US); Martin Kuhlmann, Irvine, CA (US); Vin P Hue, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 771 days.

(21) Appl. No.: 11/013,489

(22) Filed: Dec. 15, 2004

(65) Prior Publication Data

US 2006/0020864 A1      Jan. 26, 2006

Related U.S. Application Data

(60) Provisional application No. 60/590,664, filed on Jul. 23, 2004.

(51) Int. Cl.
*G06F 11/26*      (2006.01)

(52) U.S. Cl. ............................... 713/1; 713/2; 713/193; 714/726; 714/727

(58) Field of Classification Search ................. 713/1, 713/2, 193; 714/726, 727
See application file for complete search history.

(56) References Cited

U.S. PATENT DOCUMENTS

| 5,357,572 | A  | * | 10/1994 | Bianco et al. ............ 713/193 |
| 5,898,776 | A  | * | 4/1999  | Apland et al. ............... 326/8 |
| 7,185,249 | B2 | * | 2/2007  | Tkacik et al. ............ 714/726 |

* cited by examiner

*Primary Examiner*—Emmanuel L Moise
*Assistant Examiner*—Paul Callahan
(74) *Attorney, Agent, or Firm*—McAndrews, Held & Malloy, Ltd.

(57) ABSTRACT

Aspects of a method and system for blocking data in scan registers from being shifted out of a device may comprise preventing data intrusion in an integrated circuit by generating a device reset signal prior to entering scan mode. The method may further comprise detecting an attempt to enter said scan mode. The device reset signal may also be an internal reset signal. A subsequent device reset signal may be generated after entering scan mode. The subsequent device reset signal may be an internal pulse signal. The method may further comprise clearing stored data in an integrated circuit after generating a subsequent device reset signal.

20 Claims, 7 Drawing Sheets

METHOD AND SYSTEM FOR BLOCKING DATA IN SCAN REGISTERS FROM BEING SHIFTED OUT OF A DEVICE

CROSS-REFERENCE TO RELATED APPLICATIONS/INCORPORATION BY REFERENCE

This application makes reference to, claims priority to, and claims the benefit of U.S. Provisional Application Ser. No. 60/590,664 filed Jul. 23, 2004.

The above stated application is hereby incorporated herein by reference in its entirety.

FIELD OF THE INVENTION

Certain embodiments of the invention relate to data protection. More specifically, certain embodiments of the invention relate to a method and system for blocking data in scan registers from being shifted out of a device.

BACKGROUND OF THE INVENTION

Scan mode is a mode where all scan chain flip-flops in a chip may be tested using the test methodology known in the art as boundary scan. A chip may alternately be known as an integrated circuit, integrated circuit chip, integrated circuit device, or device, which comprises a plurality of flip flops arranged in a scan chain. Scan mode may exist on all the flip-flops in an entire chip which may be configured in very long chains or which may be arranged into smaller segments. Scan mode may be utilized for factory testing. The flip-flops may be connected in a daisy chain configuration and during scan testing, designated bit patterns of logic 0's and logic 1s may be shifted through the daisy-chained flip-flops. A control circuit may be utilized to clock data that has been shifted into the daisy-chained flip-flops in order to shift the clocked data by one flip-flop. The resulting shifted data may then be shifted back out and compared with the data that was shifted in order to determine whether there are any stuck bits, broken links, open circuits, shorts, and/or other defects.

In certain instances, important information such as security keys may be stored in the flip-flops of a chip when the chip is functioning in normal operating mode. Whenever this happens, all the data in the flip-flop may be shifted out of the scan chain in order to capture all of the states of the flip-flops. These states of the flip-flops may include information pertaining to all of the keys. Accordingly, with knowledge of the internals of the chip, one skilled in the art may be able to assemble all this information and decipher the keys in order to compromise data integrity.

In set-top boxes that have conditional access systems, for example, a hacker may halt the normal operation of the chip and enter scan mode, which is utilized to test the flip-flops. Once access is gained to the flip-flop during scan mode, the data in the flip-flops may be acquired by shifting out the contents of at least a portion of the flip-flops that have secure information stored therein. Accordingly, access to scan mode should be prevented during operation to ensure integrity of data such as security keys that are stored in the flip-flops of a chip.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention may be found in a method and system for blocking data in scan registers from being shifted out of a device. Aspects of the method for preventing data intrusion in an integrated circuit may comprise generating a device reset signal prior to entering scan mode. The method may further comprise detecting an attempt to enter scan mode. In one aspect of the invention, the device reset signal may be an internal reset signal. Notwithstanding, a subsequent device reset signal may be generated after entering scan mode. The subsequent device reset signal may be an internal pulse signal. Stored data in the integrated circuit may be cleared after generating a subsequent device reset signal.

The method may comprise extending an external reset signal to generate an internal pulse signal after entering scan mode, and receiving the external reset signal and an external scan mode signal. A scan testmode signal may be generated by latching an external scan mode signal based upon the device reset signal. A scan testmode delay signal may be generated based upon a delayed version of the scan testmode signal. An internal pulse signal may be generated based upon the scan testmode signal and the scan testmode delay signal. The method may further comprise generating the internal pulse signal as a logical XNOR sum of the scan testmode signal and the scan testmode delay signal.

Aspects of a system for blocking data in scan registers from being shifted out of a device may comprise circuitry that prevents data intrusion in an integrated circuit by generating a device reset signal prior to entering scan mode. The system may further comprise circuitry that may be adapted to detect an attempt to enter scan mode. In one aspect of the invention, the device reset signal may be an internal reset signal. Circuitry may be provided for generating a subsequent device reset signal after entering scan mode. The subsequent device reset signal may be an internal pulse signal. Circuitry may be adapted to clear stored data in the integrated circuit after generating the subsequent device reset signal.

The system may comprise circuitry that extends an external reset signal to generate an internal pulse signal after entering scan mode. The system may further comprise circuitry that receives the external reset signal and an external scan mode signal. A scan testmode signal may be generated by latching an external scan mode signal based upon the device reset signal. Circuitry may be provided to generate a scan testmode delay signal based upon a delayed version of the scan testmode signal. An internal pulse signal may be generated by circuitry based upon the scan testmode signal and the scan testmode delay signal. The system may further comprise circuitry that generates the internal pulse signal as a logical XNOR sum of the scan testmode signal and the scan testmode delay signal.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for blocking data in scan registers from being shifted out of a device. In an embodiment of the invention, whenever an attempt is made to activate or enter scan mode, a chip-wide reset is generated to the flip-flops throughout the chip. The chip-wide reset may be an asynchronous reset event. Notwithstanding, when a reset is issued to the flip-flops within the chip, all the data in the flip-flops gets cleared. Accordingly, if scan mode is entered after the reset is issued, then the keys or data related to the keys will no longer be present in the flip-flops. Since scan mode is not intended to be utilized outside of factory testing, clearing of the flip-flops prior to entering scan mode does not adversely affect operation of the chip. In addition to clearing all the flip-flops prior to entering scan mode, another aspect of the invention ensures that scan mode cannot be entered until after a reset is issued. As a result, entering scan mode ensures that all the flip-flops in the chip are cleared in order to guarantee that security key or key related data handled by the chip is not compromised.

Figure 1:
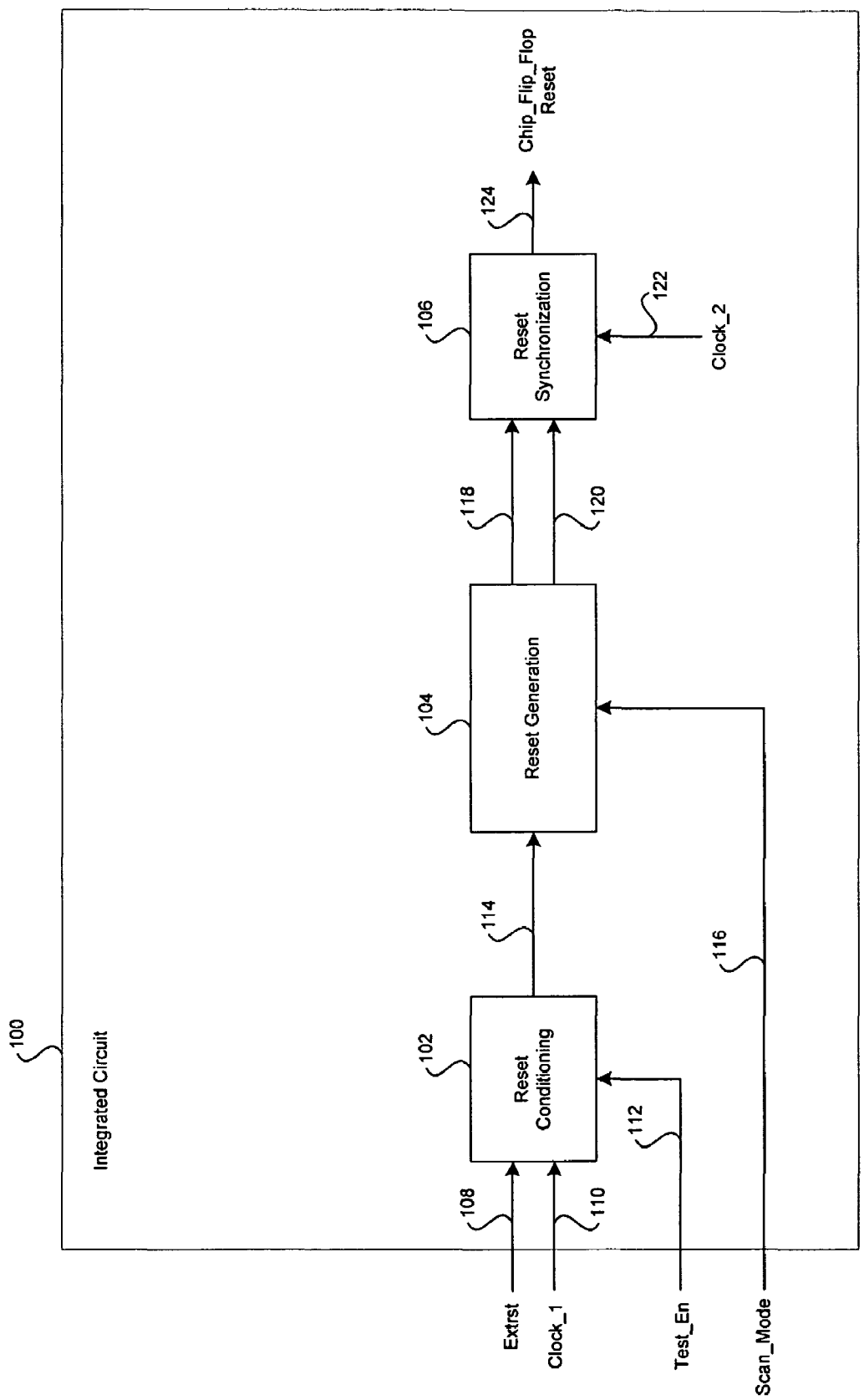
FIG. 1 is a block diagram of an exemplary system for blocking data in scan registers from being shifted out of a device, in accordance with an embodiment of the invention.

FIG. 1 is a block diagram of an exemplary system for blocking data in scan registers from being shifted out of a device, in accordance with an embodiment of the invention. Referring to FIG. 1, the exemplary system comprises an integrated circuit 100, which in turn comprises a reset conditioning stage 102, a reset generation stage 104, and a reset synchronization stage 106. An external reset (extrst) signal 108 is coupled to an input to the reset conditioning stage 102 as is a clock 1 (clock_1) signal 110 and a test enable (test_en) signal 112. The internal reset signal 114 is an output from the reset conditioning stage 102. The reset generation stage 104 may be adapted to receive as an input, the internal reset signal 114 and a scan mode (scan_mode) signal 116. Outputs from the reset generation stage are an asynchronous reset (async_reset) signal 118 and a scan testmode (scan_testmode) signal 120. The reset synchronization stage receives as inputs the asynchronous reset (async_reset) signal 118 and scan testmode (scan_testmode) signal 120 and a clock 2 (clock_2) signal 122. The chip flip flop reset (chip_flip_flop_reset) signal 124 is the output from the reset synchronization stage.

Figure 2:
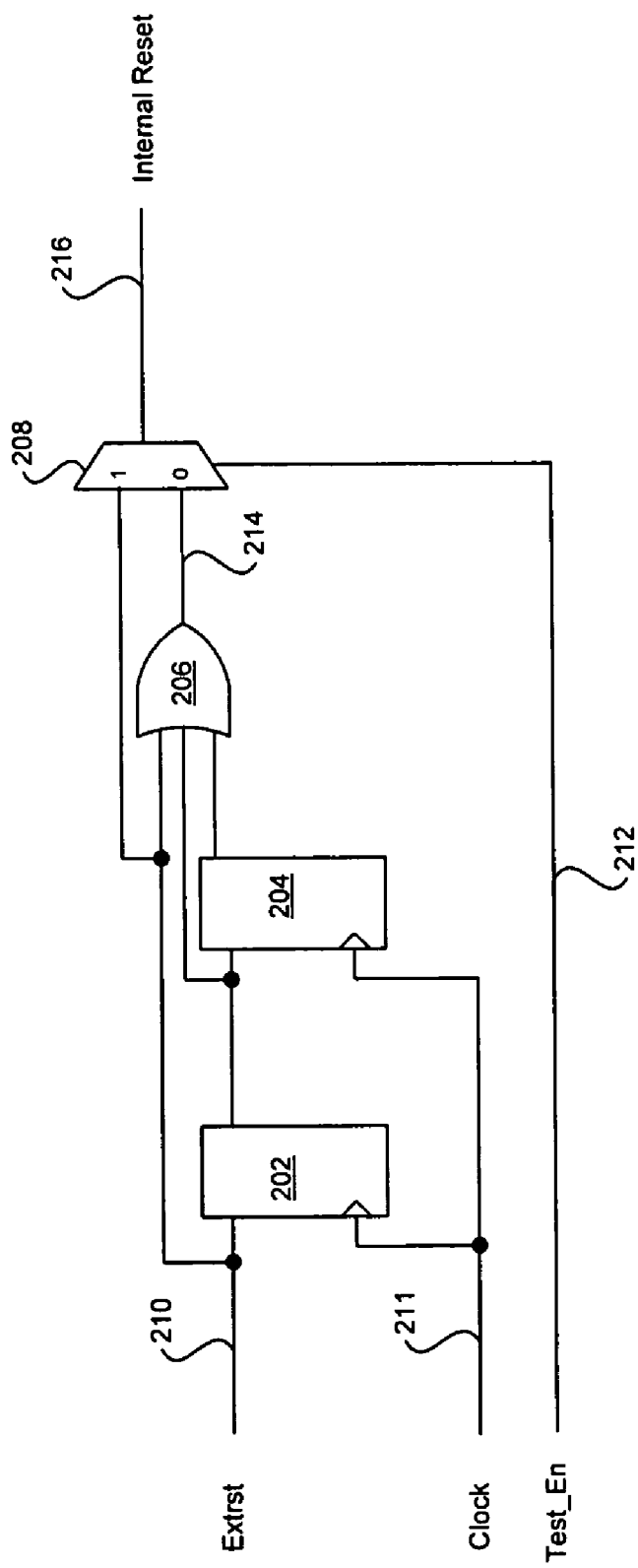
FIG. 2 is a block diagram illustrating the reset conditioning stage of FIG. 1, for example, in accordance with an embodiment of the invention.

FIG. 2 is a block diagram illustrating the reset conditioning stage of FIG. 1, for example, in accordance with an embodiment of the invention. Referring to FIG. 2, the reset conditioning stage comprises deglitching flip flops 202 and 204, a logical OR gate 206, and a multiplexer 208. The external reset (extrst) signal 210 signal is provided as an input of the flip flop 202. The clock signal 211 is coupled to both flip flops 202 and 204. The test enable (test_en) signal 212 is provided as an input to the multiplexer 208. The output signal generated by the multiplexer 208 is the internal reset signal 216. An intermediate signal 214 is provided as an output of the logical OR gate 206.

Flip flops 202 and 204 may be adapted to perform a deglitching function on the external reset (extrst) signal 210 by filtering transient glitches in the external reset (extrst) signal 210. Flip flop 202 may generate a signal which is delayed in time by, for example, one period of the clock signal 211 from the external reset (extrst) signal 210. Flip flop 204 may generate a signal which is delayed in time by, for example, two periods of the clock signal 211 from the external reset (extrst) signal 210. The external reset (extrst) signal 210, along with outputs from flip flops 202 and 204 may be provided as inputs to the logical OR gate 206. The flip flops 202 and 204 may be configured to filter transient glitches which may occur in the external reset (extrst) signal 210. A signal level in the external reset (extrst) signal 210 that is latched into flip flop 202 may be presented in the intermediate signal 214 through, for example, 2 additional periods of the clock signal 210. The test enable (test_en) signal 212 may control the multiplexer 208. When the test enable (test_en) signal is asserted to a logical high state, the multiplexer 208 may couple the external reset (extrst) signal 210 to the internal reset signal 216, which is the output from the multiplexer 208. When the test enable (test_en) signal is deasserted, for example, to a low state, the multiplexer 208 may couple the intermediate signal 214 to the internal reset signal 216, which is the output from the multiplexer 208.

Figure 3:
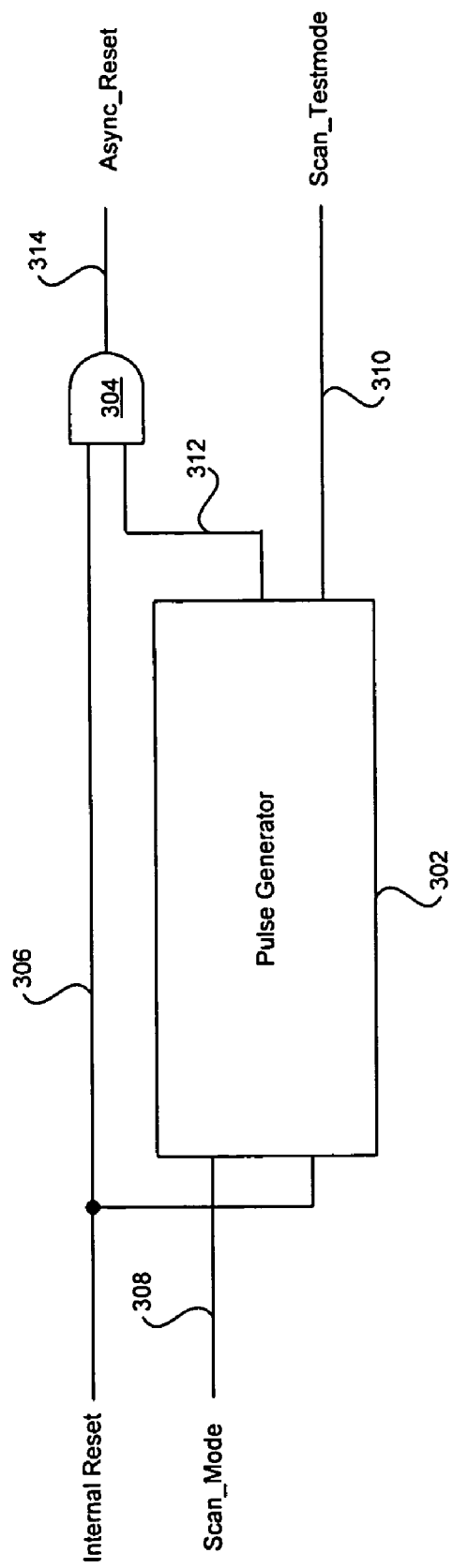
FIG. 3 is a block diagram illustrating circuitry for the reset generation stage of FIG. 1, for example, in accordance with an embodiment of the invention.

FIG. 3 is a block diagram illustrating circuitry for the reset generation stage of FIG. 1, for example, in accordance with an embodiment of the invention. Referring to FIG. 3 the reset generation stage comprises a pulse generation block 302, and a logical AND gate 304. The internal reset signal 306 may be provided as an input to the logical AND gate 304 and to an input to the pulse generator block 302. The scan mode (scan_mode) signal 308 may be provided as an input to the pulse generator block 302. The pulse generator block generator block 302 may be adapted to generate a scan_testmode (scan_testmode) signal 310, and an internal pulse 312. The internal pulse 312 may be coupled to an input to the logical AND gate 304. The logical AND gate 304 may generate an asynchronous reset (async_reset) signal 314. The pulse generator block 302 may utilize the internal reset signal 306 and the scan mode (scan_mode) signal 308 to generate the internal pulse 312 and the scan testmode (scan_testmode) signal 310. The logical AND gate 304 may adapt a logical AND product of the internal reset signal 306 and the internal pulse 312 to generate the asynchronous reset (async_reset) signal 314.

Figure 4:
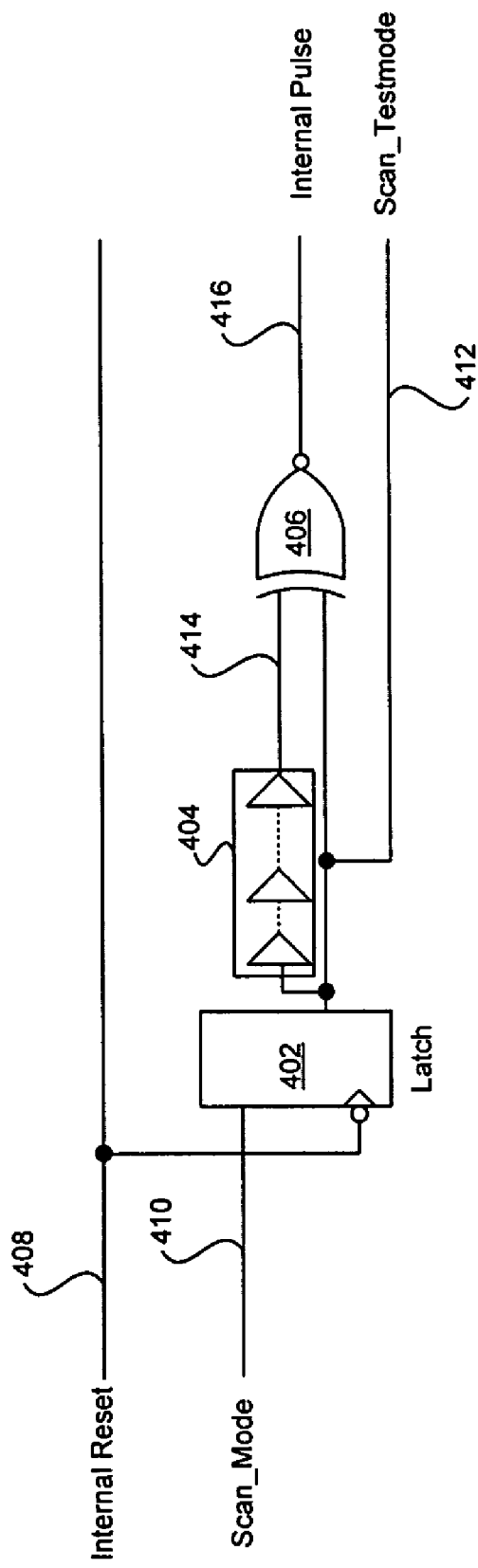
FIG. 4 is a block diagram illustrating circuitry for pulse generation, in accordance with an embodiment of the invention.

FIG. 4 is a block diagram illustrating circuitry for pulse generation, in accordance with an embodiment of the invention. Referring to FIG. 4 the pulse generation block comprises a latch 402, a time delay element 404, which may be implemented utilizing a plurality of buffers, and a logical XNOR gate 406. The internal reset signal 408 may be provided as an input to the latch 402. The scan mode (scan_mode) signal 410 may also be provided as an input to the latch 402. The scan testmode (scan_testmode) signal 412 may be generated from an output of the latch 402. The scan testmode (scan_testmode) signal 412 may also be provided as an input to the delay element 404. The output from the time delay element 404 is the scan testmode delay (scan_testmode_delay) signal 414. The scan testmode (scan_testmode) signal 412 may be provides as an input to the logical XNOR gate 406. The scan testmode delay (scan_testmode_delay) signals may also be provided as an input to the logical XNOR gate 406. The output from the logical XNOR gate 406 may be utilized as an internal pulse signal 416.

When the internal reset 408 signal is deasserted at the input of the latch 402, the scan mode (scan_mode) signal 410 present at the input of the latch 402 may be utilized to generate the scan testmode (scan_testmode) signal 412. The time delay element 404 may generate a scan testmode delay (scan_testmode_delay) signal 414 which may represent a recreation of the scan testmode (scan_testmode) signal that has been delayed by a determined amount of time. The logical XNOR gate 406 may generate an internal pulse signal 416 based upon adapting a logical XNOR sum of the scan testmode (scan_testmode) signal 412 and the scan testmode delay (scan_testmode_delay) signal 414. The amount of time delay which is introduced by the time delay element 404 may create an interval of time during which the logic level of the scan testmode (scan_testmode) signal 412 may differ from the logic level of the scan testmode delay (scan_testmode_delay) signal 414 at the inputs of the logical XNOR gate 406. During that interval, the output from the logical XNOR gate may be deasserted. When the logic level of the scan testmode (scan_testmode) signal 412 does not differ from the logic level of the scan testmode delay (scan_testmode_delay) signal 414, the output from the logical XNOR gate may be asserted. Thus, in the time domain, the internal pulse signal 416 may represent a pulse at the deasserted logic level whose width is based upon the amount of delay, which is introduced by the time delay element 404. There may be no such minimum pulse width constraint on the internal reset signal 408.

Figure 5:
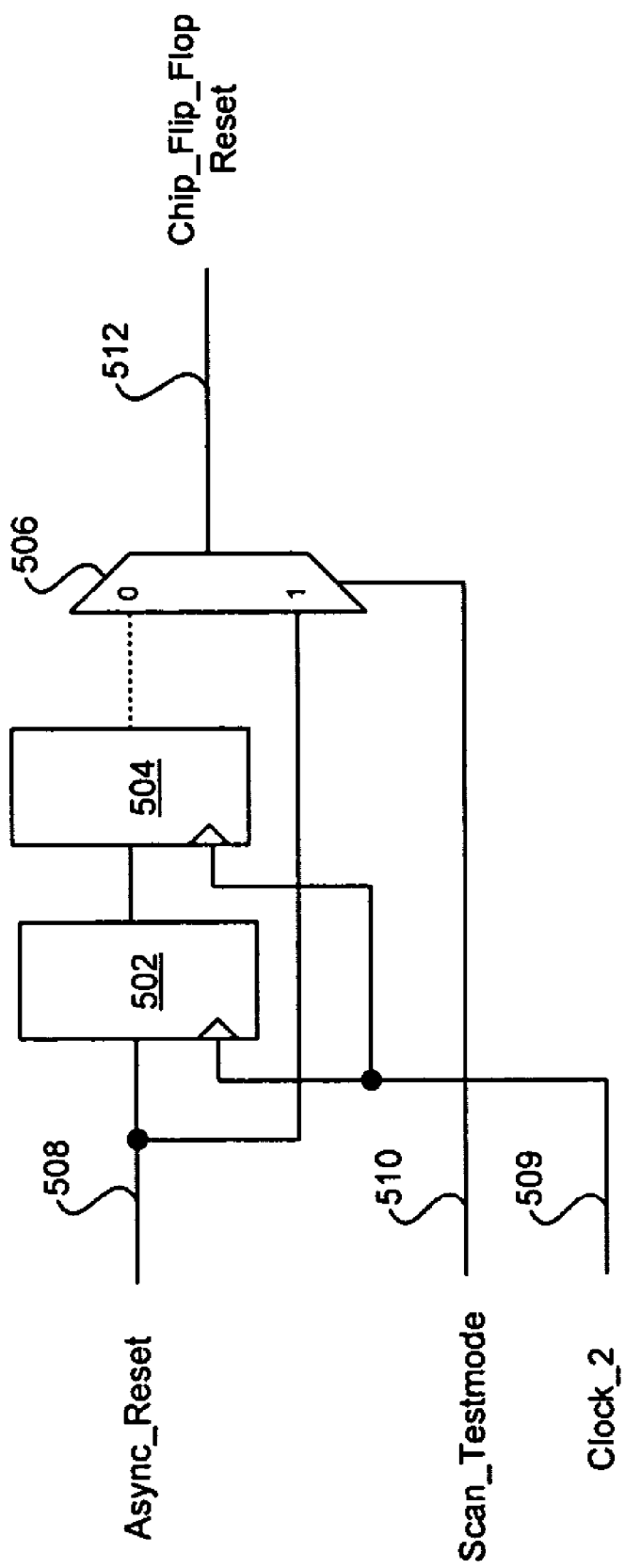
FIG. 5 is a block diagram illustrating circuitry for reset synchronization, in accordance with an embodiment of the invention.

FIG. 5 is a block diagram illustrating circuitry for reset synchronization in accordance with an embodiment of the invention. Referring to FIG. 5 the reset synchronization stage may comprise synchronizing flip flops 502 and 504, and a multiplexer 506. The asynchronous reset (async_reset) signal 508 may be an input to flip flop 502. The clock 2 (clock_2) signal 509 may be provided as an input to flip flops 502 and 504. The asynchronous reset (async_reset) signal 508 may also be provided as an input to the multiplexer 506. The scan testmode (scan_testmode) signal 510 may be provided as an input to the multiplexer 506. The output from flip flop 504 may be provided as to an input of the multiplexer 506. The chip flip flop reset (chip_flip_flop_reset) signal 512 may be generated as an output from the multiplexer 506.

The flip flops 502 and 504 may perform a clock synchronization of the reset signal to the clock domains of the flip flops on the chip. The flip flops may achieve this by latching inputs synchronously with the clock 2 (clock_2) signal 509. The flip flops 502 and 504 may also be adapted to extend or stretch the length of the reset signal in accordance with timing needs on the chip. In this regard, the length of the reset signal pulse is extended to ensure that all the flip-flops are reset chip-wide. The output from flip flop 502 may reflect the asynchronous reset (async_reset) signal 508 delayed by a period of time of one cycle of the clock 2 (clock_2) signal 509. The output from flip flop 504 may reflect the asynchronous reset (async_reset) signal 508 delayed by a period of time of two cycles of the clock 2 (clock_2) 509 clock. The scan testmode (scan_testmode) signal 510 may control the multiplexer 506. When the scan testmode (scan_testmode) signal 510 is asserted the multiplexer may couple the asynchronous reset (async_reset) signal 508 to the chip flip flop reset (chip_flip_flop_reset) signal 512 which is output from the multiplexer 506. When the scan testmode (scan_testmode) signal 510 is deasserted the multiplexer may be adapted to couple the output from flip flop 504 to the chip flip flop reset (chip_flip_flop_reset) signal 512 which may be generated as an output from the multiplexer 506. The chip flip flop reset (chip_flip_flop_reset) signal 512 may be the signal which effects the reset of flip flops on a chip.

In operation the test enable (test_en) signal 112 in FIG. 1 is asserted during scan mode. This may ensure that the external reset (extrst) signal (108 in FIG. 1) is coupled to the internal reset signal (114 in FIG. 1), bypassing the deglitching flip flops in the reset conditioning stage (102 in FIG. 1). Entry into scan mode may comprise asserting the scan mode signal. However, scan mode may not be initiated until the external reset (extrst) signal is deasserted with the scan mode signal asserted. The external reset signal should reset data contained in flip flops in the chip but if the external reset signal is deasserted for too short of a period of time, there may be instances when all the flip flops may fail to reset completely and data may still be left stored in the flip flops. But the external reset signal, which may be deasserted for too short of a period of time to reset the flip flops, may be long enough to adapt the chip to scan mode. Entry into scan mode with data stored in flip flops may enable data to be shifted out of the chip and captured in an external system, and thereby posing a potential data security breach. The pulse generator block may generate a subsequent internal reset signal, which may ensure that all the flip flops on the chip are reset before entering scan mode.

Figure 6:
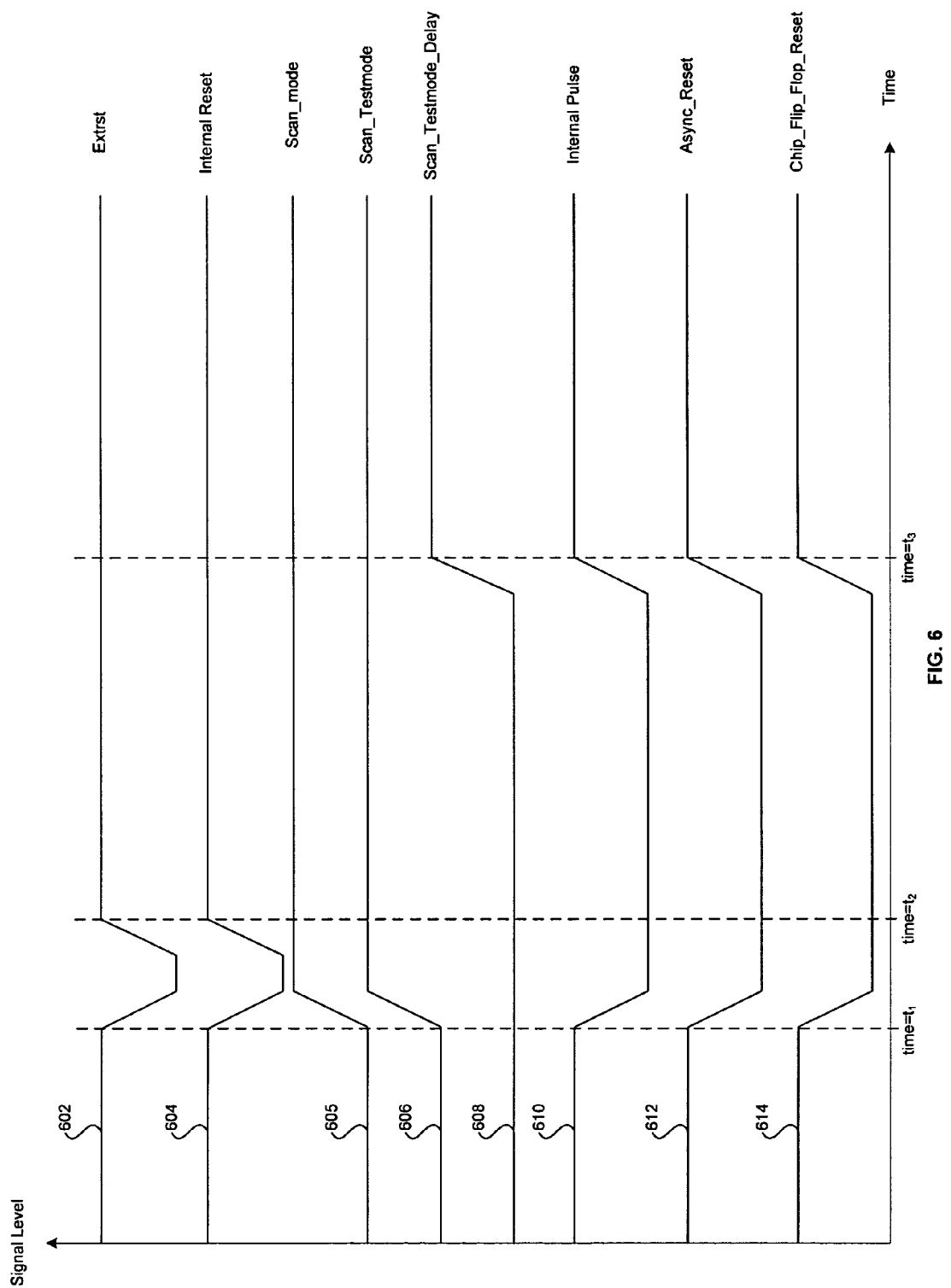
FIG. 6 is a diagram illustrating a timing diagram of signals in the exemplary system of FIG. 1, for example, in accordance with an embodiment of the invention.

FIG. 6 is a diagram illustrating a timing diagram of signals in the exemplary system of FIG. 1, for example, in accordance with an embodiment of the invention. FIG. 6 shows signal levels for a plurality of signals versus time. Referring to FIG. 6, there are shown exemplary timing waveforms for the external reset (extrst) signal 602, the internal reset signal 604, the scan mode (scan_mode) signal 605, the scan testmode (scan_testmode) signal 606, the scan testmode delay (scan_testmode_delay) signal 608, the internal pulse 610, the asynchronous reset (async_reset) signal 612, and the chip flip flop reset (chip_flip_flop_reset) signal 614. In an illustrative embodiment of the invention, it may be assumed that the test enable (test_en) signal (112 in FIG. 1) is asserted, the external reset (extrst) signal (108 in FIG. 1) is asserted prior to time=$t_1$, and the scan mode (scan_mode) signal (116 in FIG. 1) has been deasserted for a period of time which is long, in comparison to the delay time inserted by the time delay element (404 in FIG. 1), but is asserted at time=$t_1$. Notwithstanding, the invention is not limited in this regard.

At time time=$t_1$, the external reset (extrst) signal 602 is deasserted. In response, the internal reset signal 604 may also be deasserted. Deassertion of the internal reset signal 604 may latch the scan mode (scan_mode) signal 605 which is shown in FIG. 6 as being asserted at time=$t_1$. The scan testmode delay (scan_testmode_delay) 608 signal may still indicate the previous, unasserted, level of the scan mode (scan_mode) signal 605. Thus, the internal pulse signal 610 may be deasserted. The asynchronous reset (async_reset) signal 612 may also be deasserted. The chip_flip_flop_reset (chip_flip_flop_reset) signal 614 may also be deasserted. The assertion of the scan testmode (scan_testmode) signal may couple the asynchronous reset (async_reset) signal 612 to the chip flip flop reset (chip_flip_flop_reset) signal 614. Therefore, the reset preceding entry into scan mode may be an asynchronous reset.

At a subsequent time=$t_2$, the external reset (extrst) signal 602 may be asserted. The internal reset signal may also be asserted at time=$t_2$. However, the signal level of the chip flip flop reset (chip_flip_flop_reset) signal 614 may be unaffected. This may be due to the fact that the internal pulse signal 610 may still be deasserted.

At a subsequent time=$t_3$, the scan testmode delay (scan_testmode_delay) signal 608 may be asserted. In this case, the time delay inserted by the time delay element (404 in FIG. 4) may approximately equal $t_3-t_1$. At this time, the internal pulse signal 610 may be asserted. The asynchronous reset (async_reset) signal 612 may be asserted as well. In concert with the asynchronous reset (async_reset) signal 612, the chip flip flop reset (chip_flip_flop_reset) signal 614 may be asserted. Assertion of the chip flip flop reset (chip_flip_flop_reset) signal 614 may end the attempt to reset flip flops on the chip.

The exemplary timing waveforms shown in FIG. 6 illustrate that the pulse generation stage (104 in FIG. 1) may enforce a minimum length of time for the deassertion of the chip flip flop reset signal 124 in FIG. 1, which was shown to be approximately $t_3-t_1$. This minimum length of time may be independent of the length of time that an external reset (extrst) signal was deasserted. This may ensure that the resetting of flip flops before entry into scan mode independent of the method by which an external reset signal is applied.

Figure 7:
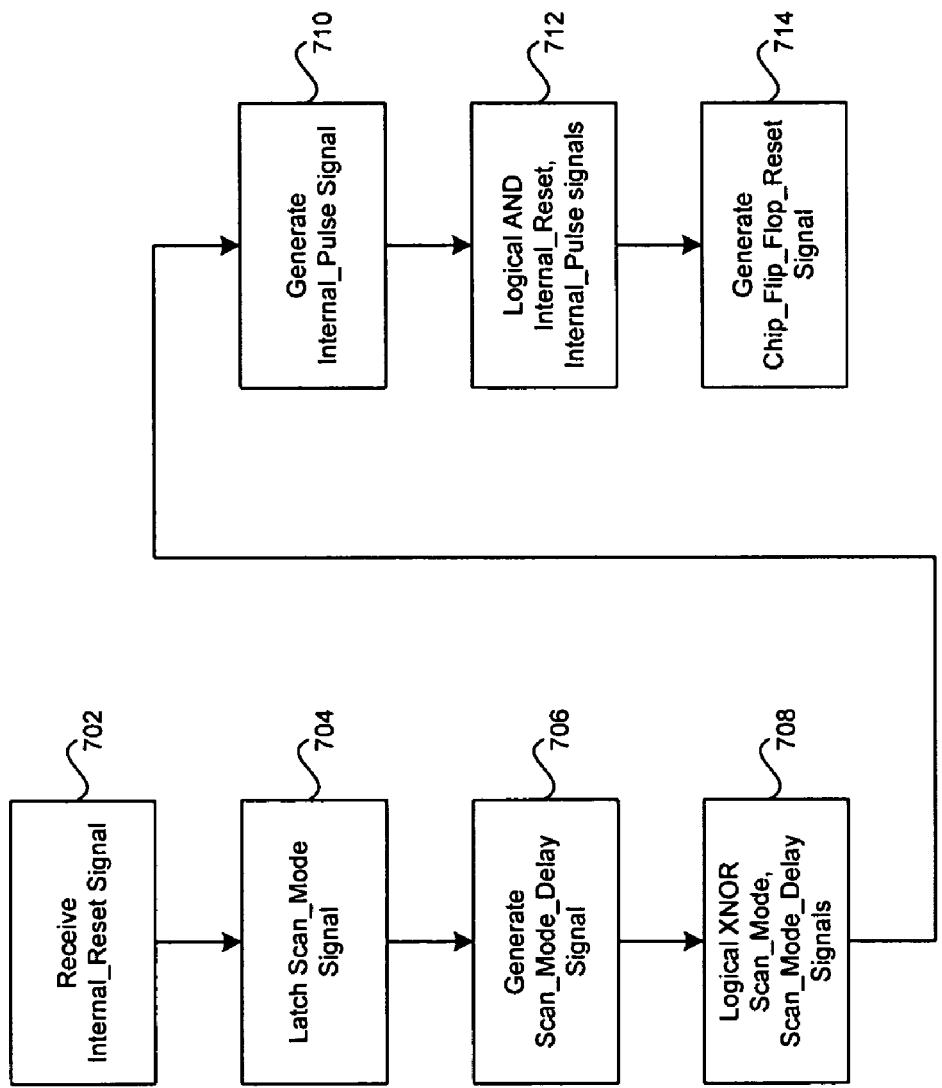
FIG. 7 is a flow chart illustrating exemplary steps in the operation of an exemplary system, in accordance with an embodiment of the invention.

FIG. 7 is a flow chart illustrating exemplary steps in the operation of an exemplary system, in accordance with an embodiment of the invention. Referring to FIG. 7, in step 702 an internal_reset signal may be received. In step 704, the scan_mode signal may be latched. In step 706, the scan_mode_delay signal may be generated. In step 708, the logical XNOR of the scan_mode and scan_mode_delay signals may be adapted. In step 710, the internal_pulse signal may be generated. In step 712, the logical AND of the internal_reset and internal_pulse signals may be adapted. In step 714, the chip_flip_flop_reset signal may be generated.

Since the scan chain flip-flops in a device may contain sensitive information such as security keys during normal operation this information should not be allowed to be shifted out or extracted from the device. The invention provides a method and system for preventing data from being shifted out or extracted from the device in scan mode. Accordingly, various aspects of the invention clears all data in the flip-flops prior to entering scan mode. Accordingly, when the device is configured in scan mode, the logic which controls this function may be set by issuing a chip reset. This results in chip-wide reset that clears all the flip-flops of any data they may contain. The invention also provides circuitry that issues a second stage of chip reset anytime scan mode is entered. This additional reset may provide a method to clear all of the data in instances where the flip-flops may not have been completely cleared via the previous reset.

It should be recognized that the invention is not limited to the scan mode operation. Accordingly, the device may be reset to clear all data from the device when any mode is changed. For example, whenever a device enters a supervisory mode, for example, all the data in the flip-flops in the scan chain may be cleared via a reset.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for preventing data intrusion in an integrated circuit, the method comprising:
   generating an internal reset signal based on an external reset signal prior to entering a scan mode, wherein said generated internal reset signal enables deletion of stored data within a chip device; and
   generating a subsequent internal reset signal based on an external test mode signal, which configures said chip device for said entering said scan mode, wherein said generated subsequent internal reset signal enables deletion of said stored data.

2. The method according to claim 1, comprising generating one or more time delayed versions of said external test mode signal based on an external clock signal.

3. The method according to claim 2, comprising generating said internal reset signal based on said one or more time delayed versions of said external test mode signal and/or an external test enable signal.

4. The method according to claim 1, comprising generating an asynchronous reset signal based on said internal reset signal and an internal pulse signal.

5. The method according to claim 4, comprising generating a time delayed version of said asynchronous reset signal based on a time domain clock signal.

6. The method according to claim 5, comprising generating a chip device reset signal based on said asynchronous reset signal, said time delayed version of said asynchronous reset signal and/or a scan testmode signal.

7. The method according to claim 6, comprising deleting said stored data based on said generated chip device reset signal.

8. A system for preventing data intrusion in an integrated circuit, the system comprising:
   one or more circuits that enable generation of an internal reset signal based on an external reset signal prior to entering a scan mode, wherein said generated internal reset signal enables deletion of stored data within a chip device; and
   said one or more circuits enable generation of a subsequent internal reset signal based on an external test mode signal, which configures said chip device for said entering said scan mode, wherein said generated subsequent internal reset signal enables deletion of said stored data.

9. The system according to claim 8, wherein said one or more circuits enable generation of one or more time delayed versions of said external test mode signal based on an external clock signal.

10. The system according to claim 9, wherein said one or more circuits enable generation of said internal reset signal based on said one or more time delayed versions of said external test mode signal and/or an external test enable signal.

11. The system according to claim 8, wherein said one or more circuits enable generation of an asynchronous reset signal based on said internal reset signal and an internal pulse signal.

12. The system according to claim 11, wherein said subsequent device reset signal is an internal pulse signal wherein said one or more circuits enable generation of a time delayed version of said asynchronous reset signal based on a time domain clock signal.

13. The system according to claim 12, wherein said one or more circuits enable generation of a chip device reset signal based on said asynchronous reset signal, said time delayed version of said asynchronous reset signal and/or a scan testmode signal.

14. The system according to claim 13, wherein said one or more circuits enable deletion of said stored data based on said generated chip device reset signal.

15. A method for operation of an integrated circuit, the method comprising:
- generating an internal reset signal prior to entering a scan mode;
- generating a scan testmode signal by latching an external scan mode signal based upon said internal reset signal; and
- generating a scan testmode delay signal based upon a delayed version of said scan testmode signal.

16. The method according to claim 15, comprising generating an internal pulse signal based upon said scan testmode signal and said scan testmode delay signal.

17. The method according to claim 16, comprising generating said internal pulse signal based on a logical exclusive-NOR operation on said scan testmode signal and said scan testmode delay signal.

18. A system for operation of an integrated circuit, the system comprising:
- one or more circuits that enable generation of an internal reset signal prior to entering a scan mode;
- said one or more circuits enable generation of a scan testmode signal by latching an external scan mode signal based upon said internal reset signal; and
- said one or more circuits enable generation of a scan testmode delay signal based upon a delayed version of said scan testmode signal.

19. The system according to claim 18, wherein said one or more circuits enable generation of an internal pulse signal based upon said scan testmode signal and said scan testmode delay signal.

20. The system according to claim 19, wherein said one or more circuits enable generation of said internal pulse signal based on a logical exclusive-NOR operation on said scan testmode signal and said scan testmode delay signal.

* * * * *